United States Patent [19]

Nakazato et al.

[11] Patent Number: 5,071,785
[45] Date of Patent: Dec. 10, 1991

[54] METHOD FOR PREPARING A SUBSTRATE FOR FORMING SEMICONDUCTOR DEVICES BY BONDING WARPED WAFERS

[75] Inventors: Yasuaki Nakazato, Koshoku; Tokio Takei, Nagano, both of Japan

[73] Assignee: Shin-Etsu Handotai Co., Ltd., Tokyo, Japan

[21] Appl. No.: 557,070

[22] Filed: Jul. 25, 1990

[30] Foreign Application Priority Data

Jul. 25, 1989 [JP] Japan ................ 1-192282

[51] Int. Cl.$^5$ .......................... H01L 21/76
[52] U.S. Cl. ........................ 437/62; 148/97; 148/DIG. 12; 437/86; 437/974; 437/976
[58] Field of Search ............ 437/62, 86, 946, 974, 437/939, 925, 976; 148/DIG. 13.5, DIG. 12, 97

[56] References Cited

U.S. PATENT DOCUMENTS

| | | | |
|---|---|---|---|
| 4,017,341 | 4/1977 | Suzuki et al. | 437/62 |
| 4,638,552 | 1/1987 | Shimbo et al. | 437/31 |
| 4,738,935 | 4/1988 | Shimbo et al. | 437/746 |
| 4,774,196 | 9/1988 | Blanchard | 437/247 |
| 4,830,984 | 5/1989 | Purdes | 148/DIG. 97 |
| 4,878,957 | 11/1989 | Yamaguchi et al. | 148/DIG. 159 |
| 4,939,101 | 7/1990 | Black et al. | 437/62 |

FOREIGN PATENT DOCUMENTS 62-158905  6/1987  Japan .
62-333867 12/1987  Japan .

Primary Examiner—Olik Chaudhuri
Assistant Examiner—Ken Horton
Attorney, Agent, or Firm—Longacre & White

[57] ABSTRACT

A new method of preparing an exceedingly flat substrate for forming semiconductor devices having an SOI structure is disclosed.

In this process at least a first wafer made of silicon single crystal is concavely warped beforehand. A second silicon single crystal wafer is bonded to the concavely warped side of the first wafer with an oxide film interposed between the first and the second wafers. Subsequently the wafers are subjected to polishing and/or etching so that the second wafer bonded is thinned into a thin film to prepare a substrate for forming semiconductor devices having a SOI structure.

At this time the polishing and/or etching cause the bonded wafers to be warped convexly to offset the concavity of the first wafer, resulting in realization of a precisely flat substrate for forming semiconductor devices having an SOI structure.

Further, at the time of determining the magnitude of the warp of the first wafer beforehand, an approximate linear equation is used which shows a relationship between the warps formed before and after the formation of the oxide film.

5 Claims, 5 Drawing Sheets

METHOD FOR PREPARING A SUBSTRATE FOR FORMING SEMICONDUCTOR DEVICES BY BONDING WARPED WAFERS

DETAILED DESCRIPTION OF THE INVENTION

1. Industrial Field of the Invention

This invention relates to an improved method for providing a substrate remarkably less in warp which is prepared for forming semiconductor devices and has an SOI (silicon on insulators) structure by means of bonding method.

2. Statement of the Prior Art

An SOI structure has hitherto been proposed for a substrate for forming semiconductor devices in order to facilitate isolation of integrated circuits in which tiny semiconductor devices are highly densely incorporated to eliminate a latch-up phenomenon in the integrated circuits, especially CMOS (Complementary Metal-Oxide Semiconductors) integrated circuits.

To provide such an SOI structure, a method has been adopted in which an oxide film (insulating layer) is formed on a silicon substrate, further a polycrystalline layer is precipitated on the oxide film, and then further a single crystalline thin film is formed through transformation of the polycrystalline layer by a laser beam irradiated thereonto. Otherwise, a method has been adopted in which a silicon polycrystalline thin film is formed on a sapphire substrate from vapor phase by way of thermal decomposition reaction for subsequent crystallization thereof.

However, the crystallinity of the silicon thin film on the insulating layer or substrate formed by these methods has not been satisfactory. Consequently, further technical improvements are being successfully made in which silicon wafers are bonded to each other with an insulating layer placed therebetween, and the resulting bonded silicon wafers are polished or etched to be formed into a desired thin layer which is used as an active region for built-in semiconductor devices of an integrated circuit.

For such a bonding method there are proposed a process of employing a simple weight for applying a pressure on the wafers and also a process of applying an electrostatic force in order to bond two wafers. The former prior art is described, for instance, in Japanese Patent Laid-Open Publication No. 48-40372. This known document teaches a method wherein silicon wafers are superposed on each other with an oxide film placed therebetween for the purpose of bonding the wafers at 1,100 degrees centigrade and higher and at pressures 100 kg/square centimeter and more. The latter prior art is described in pages 92 through 98 of "Nikkei Microdevices" issued by Nikkei-McGraw-Hill, Inc. on Mar. 1, 1988. Hereinafter such a substrate for forming semiconductor devices will be described.

In FIG. 4 (C), an example of the substrate in SOI structure for forming semiconductor devices is shown.

Wafers 1a and 1b are bonded to each other with oxide films 1c interposed therebetween. Subsequently, the side exposed to the air of the wafer 1b is polished and/or etched to be a thin film so that this substrate is achieved. The preparing process will be more particularly described as follows:

At first, prior to bonding wafers 1a and 1b to each other, as shown in FIG. 4 (A), the wafers 1a and 1b both with high precision in flatness of the surfaces are thermally oxidized over the entire surface thereof to form an oxide film 1c 0.8 micron meter in thickness. Then, wafers 1a and 1b are superposed on each other (FIG. 4 (B)), then are put into a furnace in the state of superposition and further an electrical voltage of approximately 300 volts is applied in a pulse mode across the superposed wafers in an atmosphere of nitrogen at a temperature of about 500 degrees centigrade. In this way, wafers 1a and 1b are bonded to each other. The bonded wafers thus treated have a strong bonding strength therebetween so that the wafers can be put in the conventional IC manufacturing process as they stand.

Wafer 1b of the bonded wafers thus obtained is polished and/or etched etc. from outside as it stands to be made into a thin film. Thus, a substrate with an SOI structure for forming semiconductor devices is prepared as shown in FIG. 4 (C).

Further, in a conventional technique, the abovementioned wafers 1a and 1b have been requested to be polished like a mirror surface to have a high precision flatness especially, on each surface to be bonded. Accordingly the surface has been finished so that the surface may have a highly precise flatness of 50 nm expressed in surface roughness.

In the above-mentioned process, however, when the outer surface of wafer 1b is polished and/or etched, etc. to be formed into a thin film, the bonded wafers will ordinarily have a warp convex at the outer surface of the wafer 1b. The warp will often be as large as several hundred micron meters. It is hard for the bonded wafers to be properly fixed by vacuum suction in this case. This causes a trouble in transcribing a mask pattern to the substrate in a photolithography exposure process wherein surface accuracy is highly required.

In order to find out the cause, the following experiments were made by the present inventors:

First, wafers 1a and 1b had an oxide film 1c one micron meter thick formed on the entire surface by thermal oxidization, respectively. The wafers 1a and 1b were superposed on each other to be put into a furnace. The wafers had a pulse mode voltage of 350 volts applied at a temperature of 400 degrees centigrade for the purpose of bonding the wafers. Subsequently, the oxide film 1c covering the wafer 1b was removed and the bulk of the wafer was thinned by surface-grinding. Further, the wafer 1b was subjected to etching in an alkaline solution and to polishing so that the wafer 1b had a predetermined thickness.

At this time the warps were measured on one of the staring wafer and on the wafer or a bonded wafer after each of the following steps:

Wafer 1a; wafer 1a which has had an oxide film 1c formed thereon; bonded wafers in which 1a and 1b have been bonded to each other; the bonded wafers which have been surface-ground; the bonded wafers which have been subjected to etching in an alkaline solution; and the bonded wafers which have been subjected to polishing.

The results are shown in FIG. 5. In the figure, mark (●) is for the warp of the wafer 1a; mark (▲) is for the warp of wafer 1a which has an oxide film formed thereon; mark (■) is for the warp of the bonded wafers; mark (O) is for the warp of bonded wafers which have been surface-ground; mark (Δ) is for the warp of the bonded wafers which have been subjected to etching in an alkaline solution; mark (□) is for the warp of the bonded wafers which have been subjected to polishing.

FIG. 5 shows that the warp of the wafers which have been bonded is formed in the convex direction at the wafer 1b outside surface. In the figure, it is also found that there occurs a large deformation from the state of warp after bonding of the wafers (■) to the state of warp after surface grinding of wafer 1b (O).

Next, in order to study the relationship between the warp and the process of thinning wafer 1b into a thin film, the warp caused only by surface grinding and the warp caused only by etching in an alkaline solution were examined.

As a result, it was found that as the wafer 1b was thinner, the front side, i.e., the wafer 1b side was easy to turn convex in both of the above cases. It was also found that a warp always occurred regardless of the processes of thinning the wafer 1b into a thin film.

Next, to study the influence of an oxide film 1c on a warp an oxide film was formed on one side of an ordinary wafer to examine a warp of the wafer before and after the formation of an oxide film.

As a result, it was found that the side of the wafer on which an oxide film was formed turned convex. From this fact it was found that the cause of warp lay in the oxide film 1c.

An oxide film is different from silicon single crystal in thermal expansion coefficient. Silicon single crystal is greater in thermal expansion coefficient than an oxide film. Consequently, when an oxide film is formed on the entire surface of the silicon single crystal in a high temperature atmosphere and then cooled, residual stress is accumulated within the silicon single crystal. It is considered that when an oxide film is removed from the outside front (1b side) surface of the bonded wafers to make the wafer 1b thinner for the purpose of preparing an SOI structure, the residual stress on the wafer 1a causes the front or upper side of the bonded wafers to be warped upward (in this case, the extreme thinness to five micron meters or less of the wafer 1b allows the residual stress therein to be ignored). In case there exists an oxide film 1c on the back or under side of the bonded wafers, the influence of the oxide film 1c on the formation of warp can also be considered. However, the oxide film 1c between the individual wafers 1a and 1b is far thicker than the oxide film on the backside of the wafers. Therefore the oxide film 1c between the individual wafers 1a and 1b is far greater in influence on the formation of warp.

Further, as shown in FIG. 5, additional deformations from the state of warp after bonding (■) to the state of warp after surface grinding (O) are extremely great. It is presumed that surface grinding not only removes the oxide film 1c on the front or upper surface of the bonded wafers but at the same time, also forms work strain remaining on the upper surface of the wafer 1b, which causes the front or upper surface to be expanded easily compared with the back or under surface. Further, it should be noted that a newly caused deformation from the state of warp after surface grinding (O) to the state of warp after etching in an alkaline solution (Δ) is in the concave or downward direction. It is presumed that a layer having work strain, which is the cause of the warp, induced by surface grinding is removed by etching.

SUMMARY OF THE INVENTION

This invention was made in the light of the above problems.

It is an object of the present invention to provide a substrate for forming semiconductor devices with an SOI structure which is free from warp and high precision in flatness.

The objects and novel features of the present invention stated above and also those other than stated above will be clarified in reference to the descriptions included in and the drawings accompanying to this specification.

The invention disclosed in this application will be typically summarized for description as follows:

In order to achieve the above objects, the present invention comprises a method of preparing a substrate for forming semiconductor devices having an SOI structure wherein a first wafer and a second wafer each constituted by a silicon single crystal are bonded to each other with an oxide film interposed therebetween, polished and/or etched so that said second wafer is thinned into a thin film to prepare said substrate for forming semiconductor devices having an SOI structure, the improvement comprising steps of intentionally warping at least said first wafer beforehand and of bonding said second wafer to a concave side of said first wafer.

To sum up, attention is paid to the fact that the front or upper surface side of the substrate is subjected to deformation in the direction of the upper side in forming an SOI structure. To correct this deformation, the first wafer has a deformation formed in the reverse or downward direction in advance so that the substrate can be flat in result, when the SOI structure is formed.

According to the above method, the first wafer is warped in advance. Then the second wafer is bonded to the concave side of the first wafer. A deformation of the bonded wafers at the time of forming an SOI structure reversed the warp of the bonded wafers to be offset, resulting in realization of a substrate for forming semiconductor devices having an SOI structure with an exceedingly flat surface.

DESCRIPTION OF THE PREFERRED EMBODIMENTS

A description will be made on the method for manufacturing a substrate for forming semiconductor devices having an SOI structure according to the preferred embodiments of the present invention.

Figure 1A:
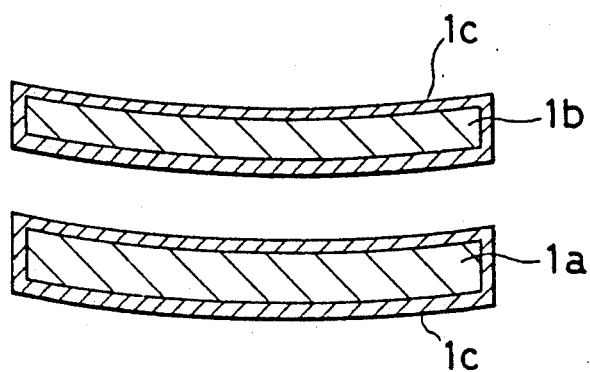
FIGS. 1 (A) through (C) are views showing manufacturing processes in the preferred embodiments wherein a substrate for forming semiconductor devices having an SOI structure according to the present invention is prepared.
Figure 1B:
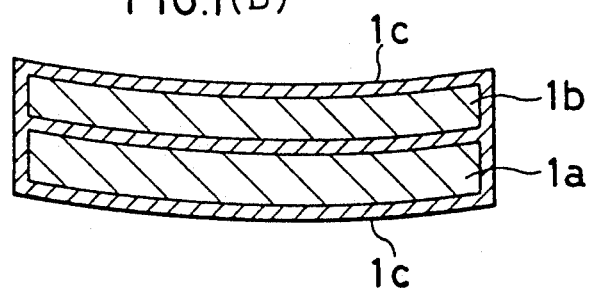
Figure 1C:
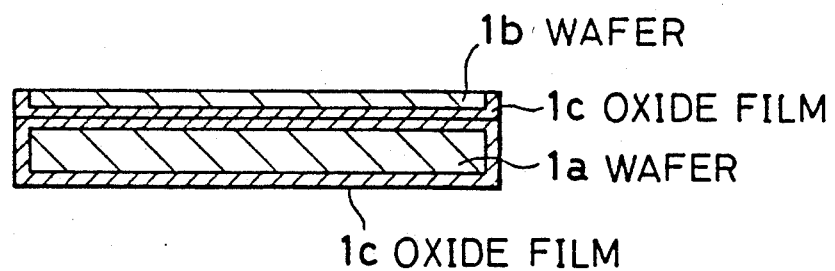

FIG. 1 (C) shows a longitudinal sectional view of the substrate having an SOI structure;

This substrate is manufactured from a pair of bonded wafers in which the wafer 1a and wafer 1b are bonded to each other with an oxide film 1c interposed therebetween, the wafer 1b being polished and/or etched into a thin film.

At this time wafers 1a and 1b are warped beforehand. Wafer 1b is bonded to the concave side of wafer 1a.

Wafer 1b to be bonded may be completely free from warp. But wafer 1b preferably has a warp formed in the same direction as 1a.

Figure 2:
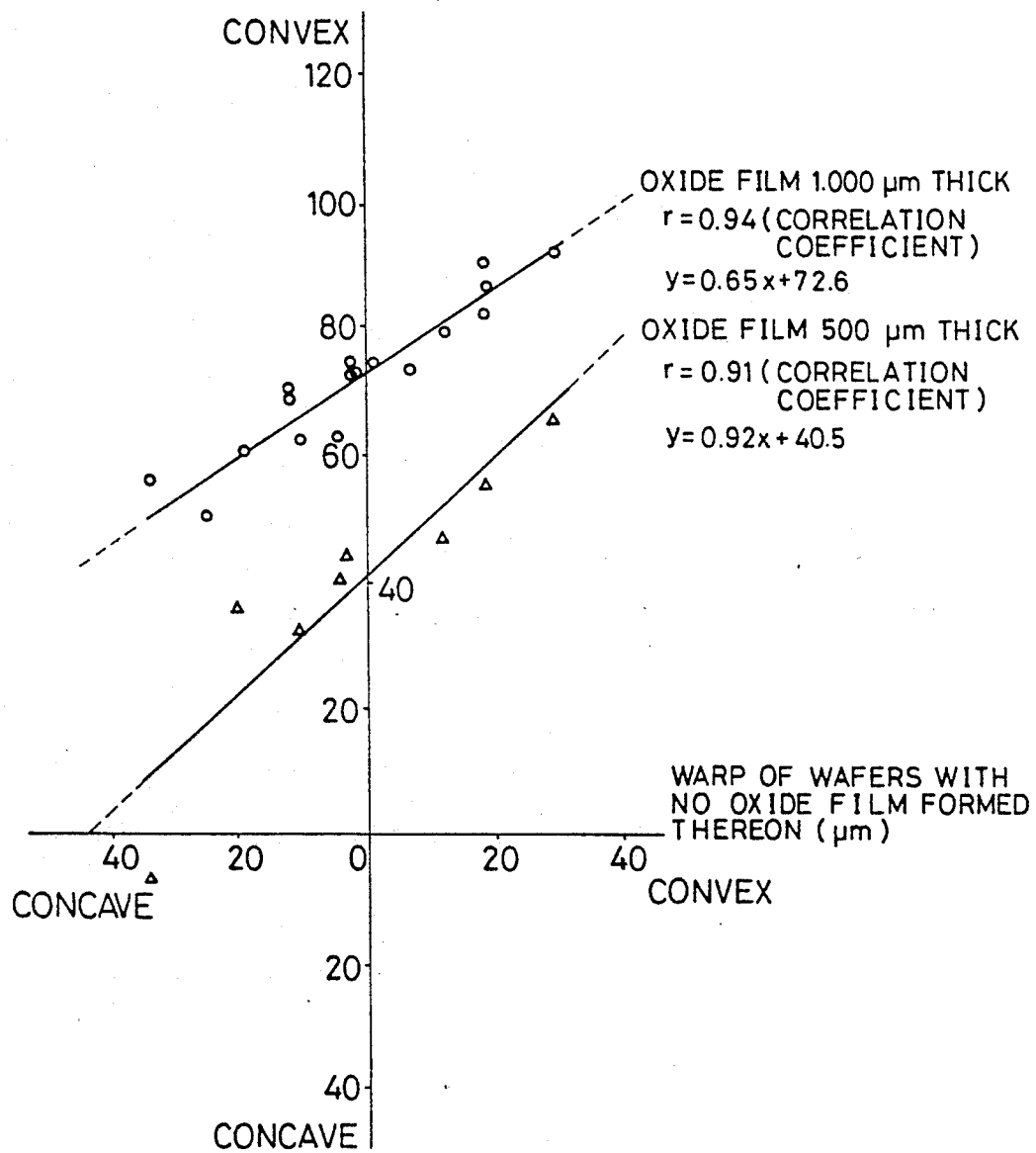
FIG. 2 is a figure showing the relationship between the thickness of an oxide film and the warp.

It is to be noted that the magnitude of the warp of wafer 1a at the time of bonding depends upon the diameters and the thicknesses of the wafers and also upon the temperature for forming the oxide film and the thicknesses thereof. For example, the degrees of the warp can be determined as follows:

FIG. 2 shows the relationship between the thickness of the oxide film and warp. In FIG. 2, a warp is shown for p-type wafers which are 150 mm in diameter and 625 micron meters in thickness. The wafers have the one side thereof formed with an oxide film 1,000 nm and 500 nm thick, respectively. On the axis of abscissa the warp of wafers prior to formation of the oxide films is shown. The conditions of forming the oxide films are the same.

It is known in FIG. 2 that the warps of wafers before and after the formation of the oxide films are correlative and that the correlation can be expressed in the form of a linear equation $y = Ax + B$ where y represents a warp after formation of the oxide film, x represents a warp prior to formation of the oxide film. A and B are constants. In FIG. 2 it is understood that the thicker the oxide film is, the larger the warp after the formation of the oxide film is.

Consequently, at first, a point where the equation $y = Ax + B$ crosses the axis of abscissa is obtained by experiments. Next, the wafer is warped beforehand so that the warped wafer has a magnitude of warp corresponding to the values obtained at the point stated above (the warp in which the oxide film forming surface is concave at the same surface). Then, the warp of the wafer disappears when the oxide film is formed.

Further, FIG. 2 shows the case wherein an oxide film is formed on one side of the wafer. Almost the same can be said to the bonded wafers which have an oxide film formed on each wafer for the purpose of producing an SOI structure, because the influence of the thinner wafer 1b on warp can be ignored. As a result it can safely be said that only wafer 1a regarded to have original warp in the bonded wafers. It should be noted in this case that the oxide film of the bonded wafers according to the present invention is two times as thick in the bonded region as the oxide film formed on each of the wafers.

Figure 3:
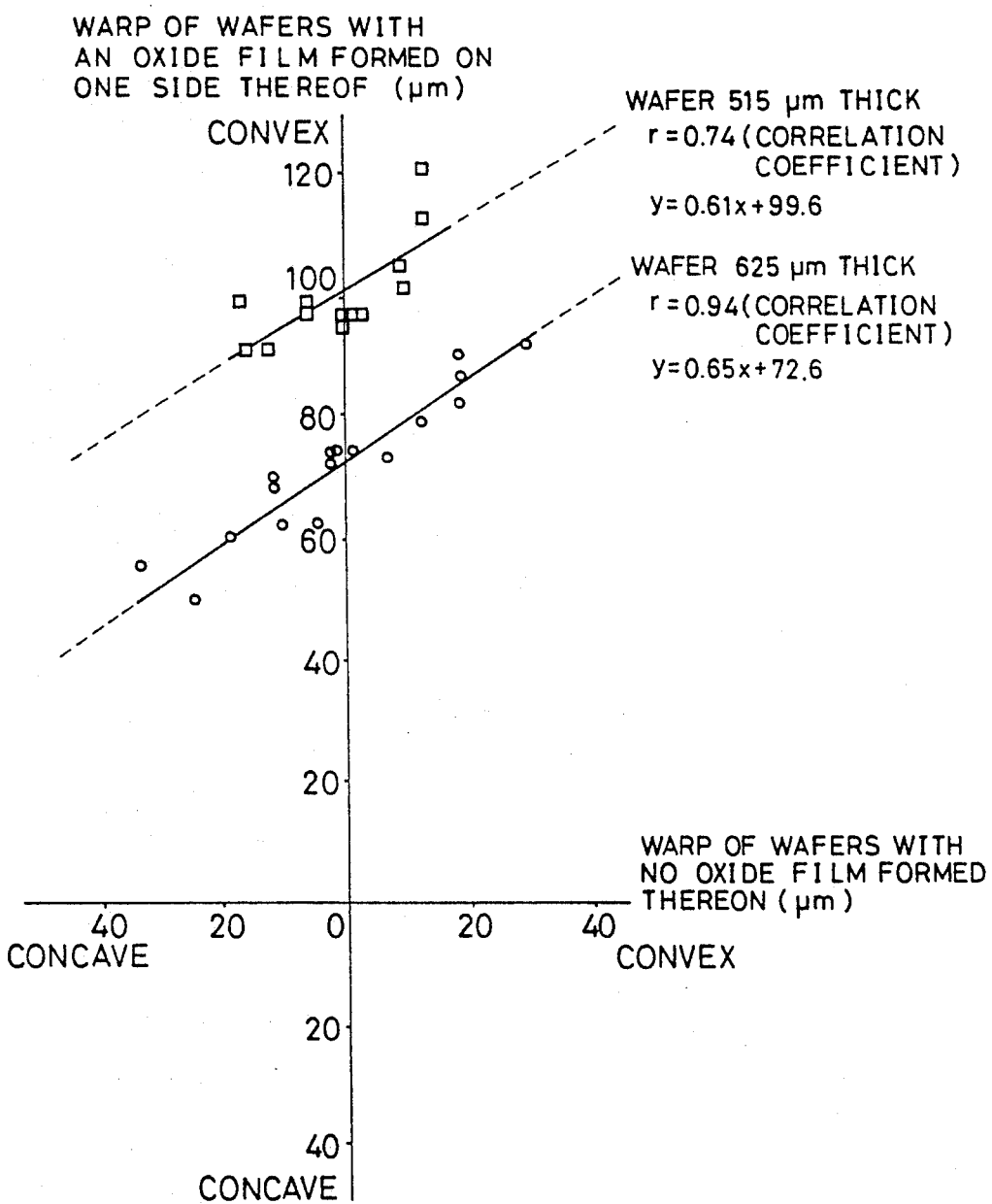
FIG. 3 is a figure showing the relationship between the thickness of the wafers and the warp.
Figure 4A:
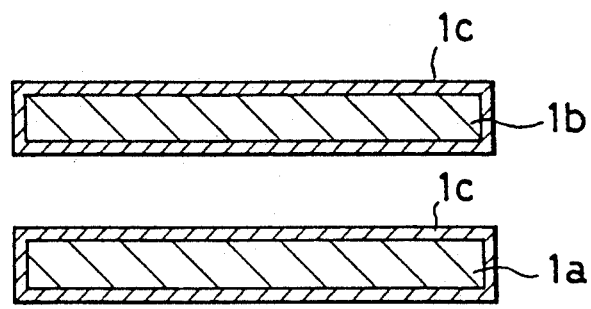
FIGS. 4 (A) through (C) are views showing the manufacturing processes of a conventional method.
Figure 4B:
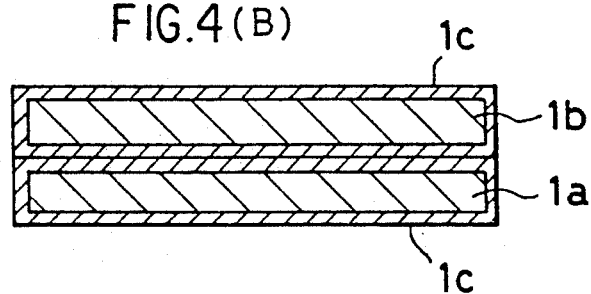
Figure 4C:
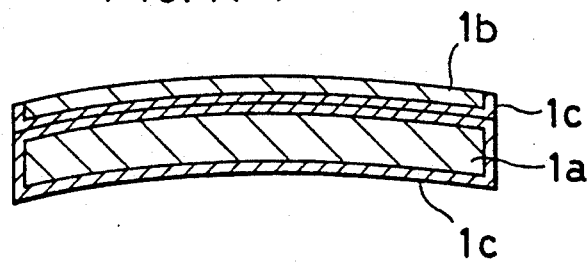
Figure 5:
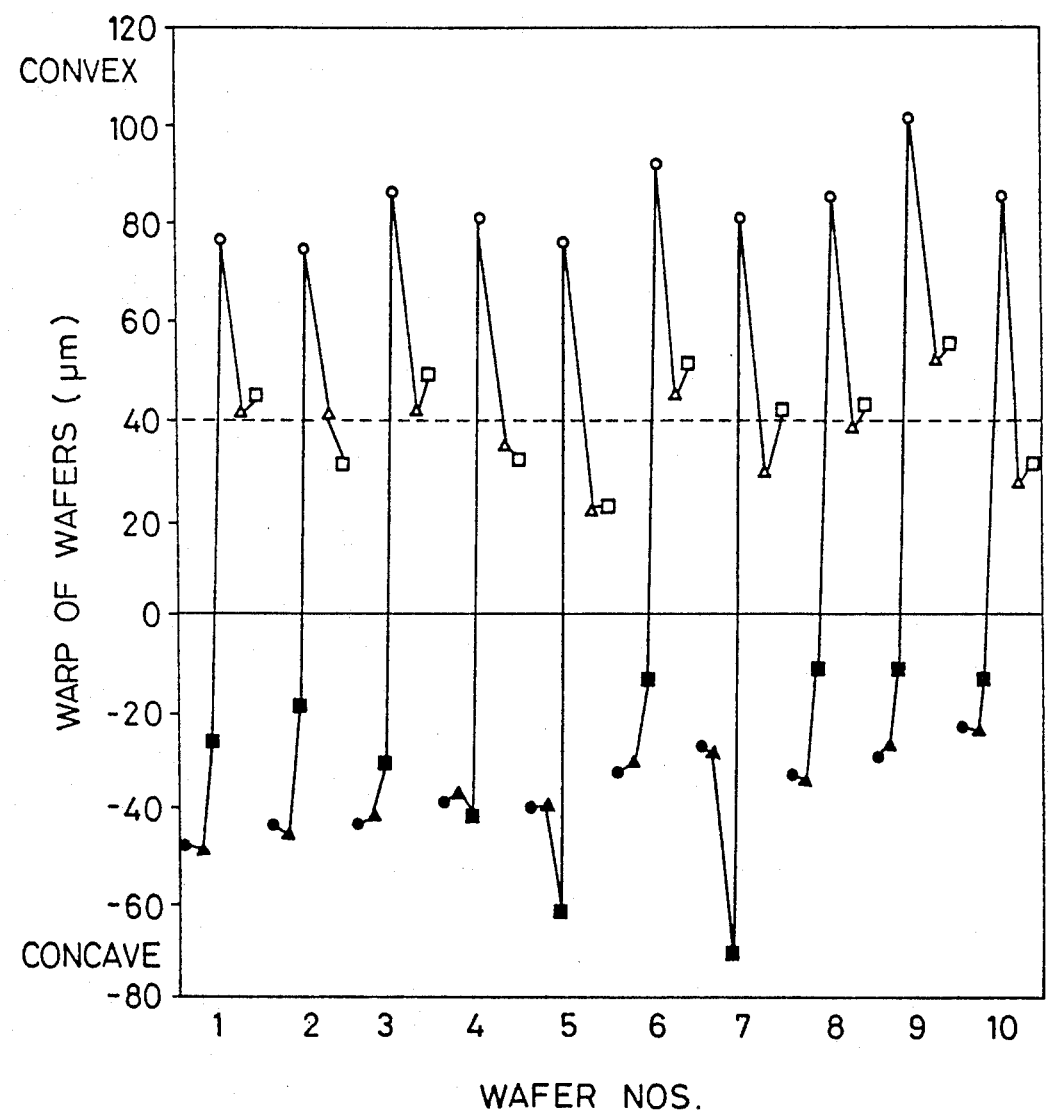
FIG. 5 is a figure showing a warp at each process.

FIG. 3 shows the relationship between the thickness of the wafers and the warp. FIG. 3 shows the warp of a p-type wafer 150 mm in diameter which has an oxide film 1,000 nm thick formed on one side thereof. The warps prior to formation of the oxide film are shown on the axis of abscissa.

In FIG. 3 it can be shown that even in case of different thicknesses of the wafers the warp before and after the formation of an oxide film are correlative and that the correlation can be expressed by a linear equation $y = A'x + B'$ (Symbol y is the warp after the formation of the oxide film; symbol x is the warp before the formation of the oxide film; A' and B' are constants.) At the same time it is known in the figure that the thinner the wafers are, the larger the warps after the formation of the oxide film are.

Consequently, in case the thicknesses of the wafers are varied, the magnitude of the warps can also be varied accordingly.

In bonding together the individual wafers already warped as stated above, an oxide film 1c is formed on the entire surfaces of wafers 1a and 1b by oxidation in steam as shown in FIG 1 (A). Then the concave surface of the wafer 1a and the convex surface of the wafer 1b are superposed on each other with an oxide film 1c interposed therebetween (FIG. 1 (B)). The wafers are put into a furnace in the state of superposition so that heat or a pulse mode voltage is applied to the superposed wafers in the atmosphere of nitrogen, whereby wafers 1a and 1b are bonded to each other. It is possible that the bonded wafers thus obtained are put in the conventional manufacturing; process as they stand, because the wafers have a strong bonding strength.

The wafer 1b of the wafers thus bonded is subjected to surface grinding, etching in an alkaline solution and to polishing for the purpose of thinning the wafer 1b into a thin film, whereby a substrate for forming semiconductor devices having an SOI structure can be obtained as shown in FIG. 1 (C). It should be noted that although wafer 1b also has a warp so that the wafers can be bonded together satisfactorily in the above case, only the wafer 1a can be warped, because the wafer 1b is thinned into a thin film with the result that the effect of the warp on the wafer 1b to the bondability of the wafers is thought to be ignored. The bonded wafers prepared in this process have the following effects:

Namely, according to the preferred embodiments stated above, wafer 1a is warped beforehand and the concave surface of the wafer 1a is bonded to the wafer 1b. The deformation of the bonded wafers in the direction of the convex side of the wafers at the time of preparing an SOI structure allows the warp of the wafer 1a to be alleviated with the consequence that a substrate for forming semiconductor devices having an SOI structure with high precision flatness can be realized.

It should be noted that when a substrate for forming semiconductor devices which is 150 mm in diameter is prepared in a conventional process, the mean value of warp was 35 microns, while a substrate prepared by the process according to the present invention had a mean value of 15 microns.

A description has hitherto been made on the present invention in reference to the preferred embodiments. The present invention is not limited only to the embodiments above. It is needless to say that various modifications can also be made within the scope of the spirit of the present invention.

The typical effects of the present invention disclosed in this specification will described as follows:

According to the present invention, a first wafer and a second wafer both constituted by a silicon single crystal are bonded to each other with an oxide film interposed therebetween, then the bonded wafers are polished and/or etched so that the second wafer is thinned into a thin film for the purpose of preparing the substrate for forming semiconductor devices having an SOI structure. At this time prior to bonding, the first wafer is intentionally warped beforehand. The second wafer is bonded to the concave side of the first wafer. As a result, the process induced deformation of the bonded wafers in making the SOI structure permits the bonded wafers to be free of warp. Thus, a substrate for semiconductor devices having an SOI structure with a high precision flatness can be realized.

What is claimed is:

1. A method of preparing a substrate for forming semi-conductor devices having an SOI structure, comprising the steps of:

warping a first silicon single crystal wafer having a first surface and a second surface so that said first surface is concave;

bonding a first surface of a second silicon single crystal wafer to said concave first surface of said first wafer, said first and second wafers having an oxide film interposed therebetween;

polishing and/or etching a second surface of said second wafer opposite said first surface thereof which is bonded to said concave first surface of said first wafer to prepare said polished and/or etched second surface of said second wafer for forming semiconductor devices having said SOI structure.

2. A method as in claim 1, wherein:

each of said first and second wafers comprise an oxide film on each of said first and second surfaces thereof.

3. A method as in claim 2, wherein:

said warping step further comprises warping said first wafer to have a concave warpage of $-B/A$, wherein B and A are constants and are calculated from the linear equation $y = Ax + B$ at $y = 0$, where y is the value of the warpage of a first wafer having a single oxide film formed on the first surface of the first wafer, said oxide film being formed by thermal oxidation, the oxide film thickness on the first surface of said first wafer being the same as the that of the oxide film interposed between the first wafer and the second wafer, the thickness of said wafer of said linear equation being the same as that of the first wafer, and x is the value of the warpage of the first surface of the wafer prior to thermal oxidation.

4. A method as in claim 1, wherein:

said oxide film is interposed between said first and second wafers is formed on either of said concave first surface of said first wafer or on said first surface of said second wafer which is bonded to said concave first surface of said first wafer.

5. A method as in claim 4, wherein:

said warping step further comprises warping said first wafer to have a concave warpage of $-B/A$, wherein B and A are constants and are calculated from the linear equation $y = Ax + B$ at $y = 0$, where y is the value of the warpage of a first wafer having a single oxide film formed on the first surface of the first wafer, said oxide film being formed by thermal oxidation, the oxide film thickness on the first surface of said first wafer being the same as that of the oxide film interposed between the first wafer and the second wafer, the thickness of said wafer of said linear equation being the same as that of the first wafer, and x is the value of the warpage of the first surface of the wafer prior to thermal oxidation.

* * * * *